United States Patent [19]
Shoji

[11] Patent Number: 5,528,534
[45] Date of Patent: Jun. 18, 1996

[54] HIGH-DENSITY READ-ONLY MEMORY EMPLOYING MULTIPLE BIT-LINE INTERCONNECTION

[75] Inventor: Masakazu Shoji, Warren, N.J.

[73] Assignee: AT&T Corp., Murray Hill, N.J.

[21] Appl. No.: 408,673

[22] Filed: Mar. 21, 1995

[51] Int. Cl.$^6$ ................................. G11C 17/00
[52] U.S. Cl. .................. 365/104; 365/94; 365/230.06; 326/105
[58] Field of Search ............... 365/104, 230.06, 365/189.05, 189.08, 94; 326/105, 106

[56] References Cited

U.S. PATENT DOCUMENTS

| | | | |
|---|---|---|---|
| 4,599,704 | 7/1986 | Mazin | 365/104 |
| 5,303,194 | 4/1994 | Suzuki | 365/189.05 X |
| 5,373,480 | 12/1994 | Kudo | 365/230.08 |
| 5,394,355 | 2/1995 | Uramoto et al. | 365/104 |

*Primary Examiner*—David C. Nelms
*Assistant Examiner*—Huan Hoang
*Attorney, Agent, or Firm*—Robert P. Marley; John M. Harman

[57] ABSTRACT

A system and method for the storage of digital information wherein data that would normally be represented by multiple bits of information is effectively stored at single memory site within a ROM. This is accomplished by employing a multiple bit-line memory architecture, in conjunction with a data decoder. With this arrangement it is possible to store, at a single memory site, information that would have required up to $\lceil \log_2(n(n-1)/2)+1 \rceil$ individual memory sites in a conventional ROM (where n is the number independent of bit-lines connected to an individual memory element in the invention). The invention is particularly well-suited to what would be considered relatively low-speed data retrieval systems, such as those adapted to provide audio and/or video to a user on a real time basis.

12 Claims, 4 Drawing Sheets

HIGH-DENSITY READ-ONLY MEMORY EMPLOYING MULTIPLE BIT-LINE INTERCONNECTION

TECHNICAL FIELD

The invention relates to the retrieval of digitized information, and in particular, to the retrieval of digitized information stored within a read-only memory ("ROM") device.

BACKGROUND OF THE INVENTION

Storing digital audio or video information of reasonable quality requires a great deal of memory. For example, it would require approximately 64 million memory sites to store 15 minutes of audio sampled at a rate of 64 kbits/s. Audio of higher quality and/or longer duration would naturally require even greater amounts of memory, and naturally, the same would be true for video. However, the capacity and density of semiconductor memory devices, particularly ROMs, have increased dramatically in recent years. As a result, the storage of substantial quantities of digitized audio and video information within such devices has become feasible.

While present ROM architectures will support the storage of large quantities of digitized audio or video information upon a single integrated device or chip, there is an ever increasing need to minimize the physical size of the chip that provides the storage. This need to minimize the physical size of memory is seen to be most critical in the portable, personal audio/video player arena. Clearly, the consumers' preference for very small portable audio and/or video entertainment units is evident from the popularity of miniature stereo cassette players and televisions. It follows that if audio and/or video is to be stored within a solid state memory device for use in portable players, it would be advantageous to utilize a storage system that could provide a greater data storage density than that of currently available ROM devices.

SUMMARY OF THE INVENTION

The aforementioned problem is solved, in accordance with the principles of the invention, by providing a system and method for the storage of digital information wherein data that would normally be represented by multiple bits of information is effectively stored at single memory site within a ROM. This is accomplished by employing a multiple bit-line memory architecture, in conjunction with a data decoder. With this arrangement it is possible to store, at a single memory site, information that would have required up to $\lceil \log_2(n(n-1)/2)+1 \rceil$ individual memory sites in a conventional ROM (where n is the number independent of bit-lines connected to an individual memory element in the invention). The invention is particularly well-suited to what would be considered relatively low-speed data retrieval systems, such as those adapted to provide audio and/or video to a user on a real time basis.

DETAILED DESCRIPTION

Figure 1:
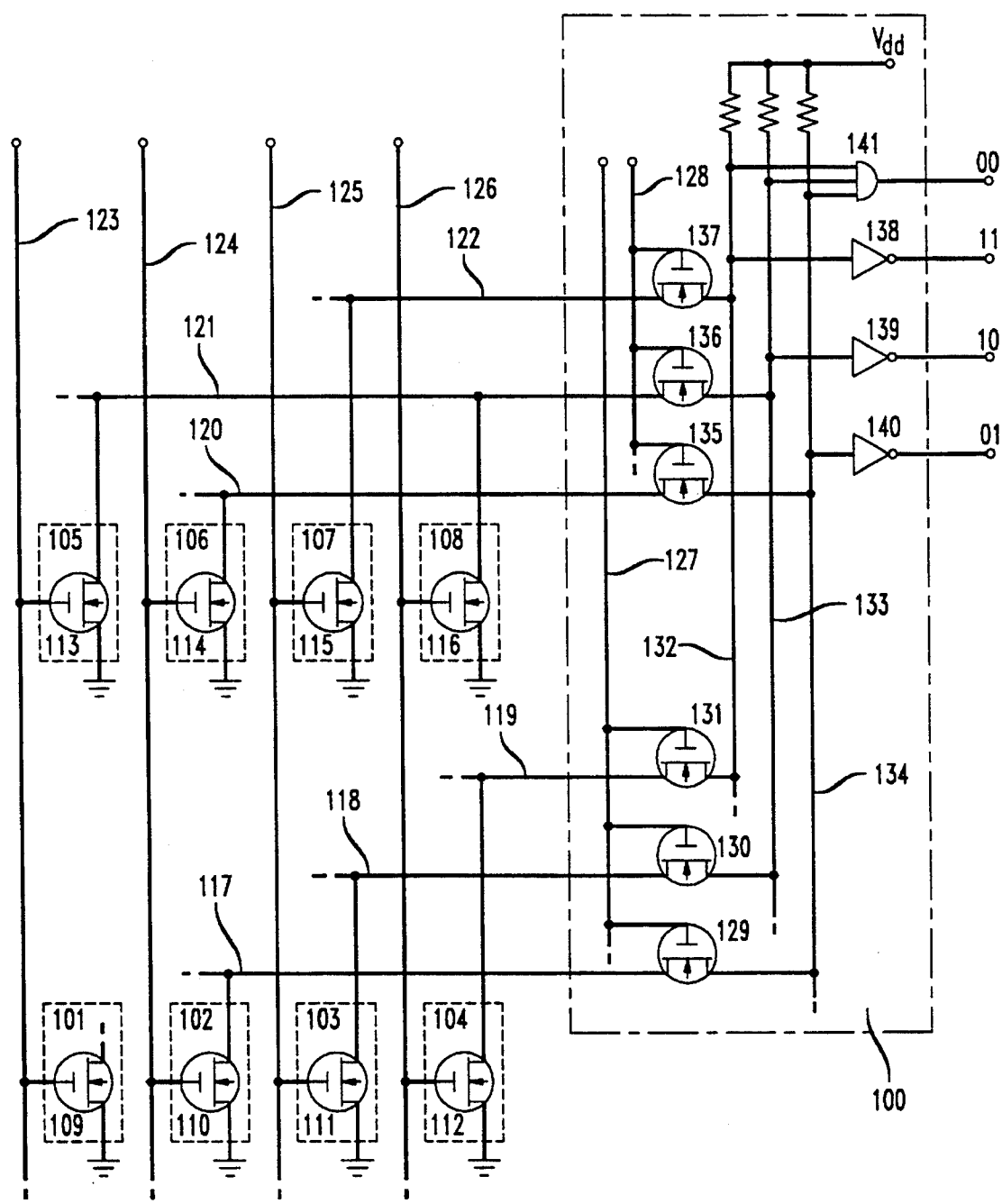
FIG. 1 is a schematic diagram showing a decoder circuit and a portion of a high-density ROM that facilitate the practice of a particular method of the invention.

FIG. 1 provides a schematic diagram showing eight memory sites (101 through 108) within a portion of a high-density ROM, and an associated decoding circuit 100. Each memory site is shown to include a field-effect transistor ("FET") (109–116). As is well known to those familiar with the art, logical values 1 and 0 are typically represented within ROMs by the presence or absence of a connection to an FET at any given memory site—One bit being stored per memory site. Each memory site within a ROM is typically addressed via a single bitline and a single wordline. In FIG. 1, lines 117–122 are bitlines, and lines 123–126 are wordlines. As is also shown, each memory site within the ROM can be addressed via three separate and distinct bitlines. For example, any one of memory sites 101–104 can be addressed via bitlines 117, 118, or 119. This three bitline addressing effectively allows data that would have required two bits of information (and two separate memory sites) to be effectively stored at each memory site. Any memory site can be made to represent any of four states corresponding to the bit series 00, 01, 10, or 11. The bit series 11 is represented by an FET that provides a switchable path between bitline 119 (the most significant bitline) and ground; an FET switchably connecting bitline 118 (the intermediate bitline) and ground represents the bit sequence 10; the sequence 01 is represented by an FET connecting bitline 117 (the least significant bitline) and ground, and the bit sequence 00 is represented when there is no connection between an FET and any of the bitlines at a particular memory site.

In order to read the two bits of information stored at a particular memory site in the circuit of FIG. 1, the three bitlines and one wordline associated with that particular memory site must be accessed. For example, to read the value of the data stored at memory site 104, wordlines 123, 124 and 125 are grounded to ensure that the channels within associated FETs 109–111 and 113–115 are maintained in a non-conductive state. Simultaneously, wordline 126 is supplied with a voltage $V_{dd}$. This applied voltage causes the channels within FET 112 and FET 116 to be placed in a conductive state, thereby selecting the column of memory sites which includes 108 and 104. A connection between decoder circuit 100 and bitlines 117, 118 and 119 is then effected. To accomplish this, bitline control conductor 127 is supplied voltage $V_{dd}$, while bitline control conductor 128 is grounded. This places the channels within FETs 129, 130 and 131 into conductive states, thereby selecting the row of memory sites 101–104 for reading (i.e., conductive paths between bitline 117 and line 134, bitline 118 and line 133, and bitline 119 and line 132 are established). The grounding of conductor 128 maintains the channels within FETs 135, 136 and 137 in non-conductive states.

With the bitlines and wordlines in the state described above, memory site 104 is selected for reading and the combinational logic devices (138–141) within decoder 100 produce the following:

high output (logical 1) at the output of inverter 138 as a result of line 132 being grounded via FETs 112 and 131, and therefore held to a logical 0 signal level;

low outputs (logical 0) at the output of inverters 139 and 140 as a result of lines 133 and 134 not being connected to ground and therefore each maintain a logical 1 signal level; and low output (logical 0) at the output of AND-gate as a result of line 132 being at a logical 0 signal level.

When the FET at the particular memory site being read provides a connection between a most significant bitline (119, 122) and ground (such as the FETs at memory sites 104 and 107) the output of inverter 138 will produce a logical 1, while all other logic device outputs will be 0. When the FET at the memory site provides a connection between an intermediate bitline (118, 121) and ground (such as the FETs at memory sites 103, 105 and 108) the output of inverter 139 will produce a logical 1, while all other logic devices output 0. When reading a memory site having an FET providing a connection between a least significant bitline (117, 120) and ground (such as the FETs at memory sites 102 and 106) the output of inverter 140 will be a logical 1, while all other logic devices will output logical 0. Finally, if the FET at the memory site being read fails to provide a connection between ground and any of the bitlines (such as the FET at memory site 101), the output of AND-gate 141 will be a logical 1, while the three inverters will output logical 0s.

Figure 2A:
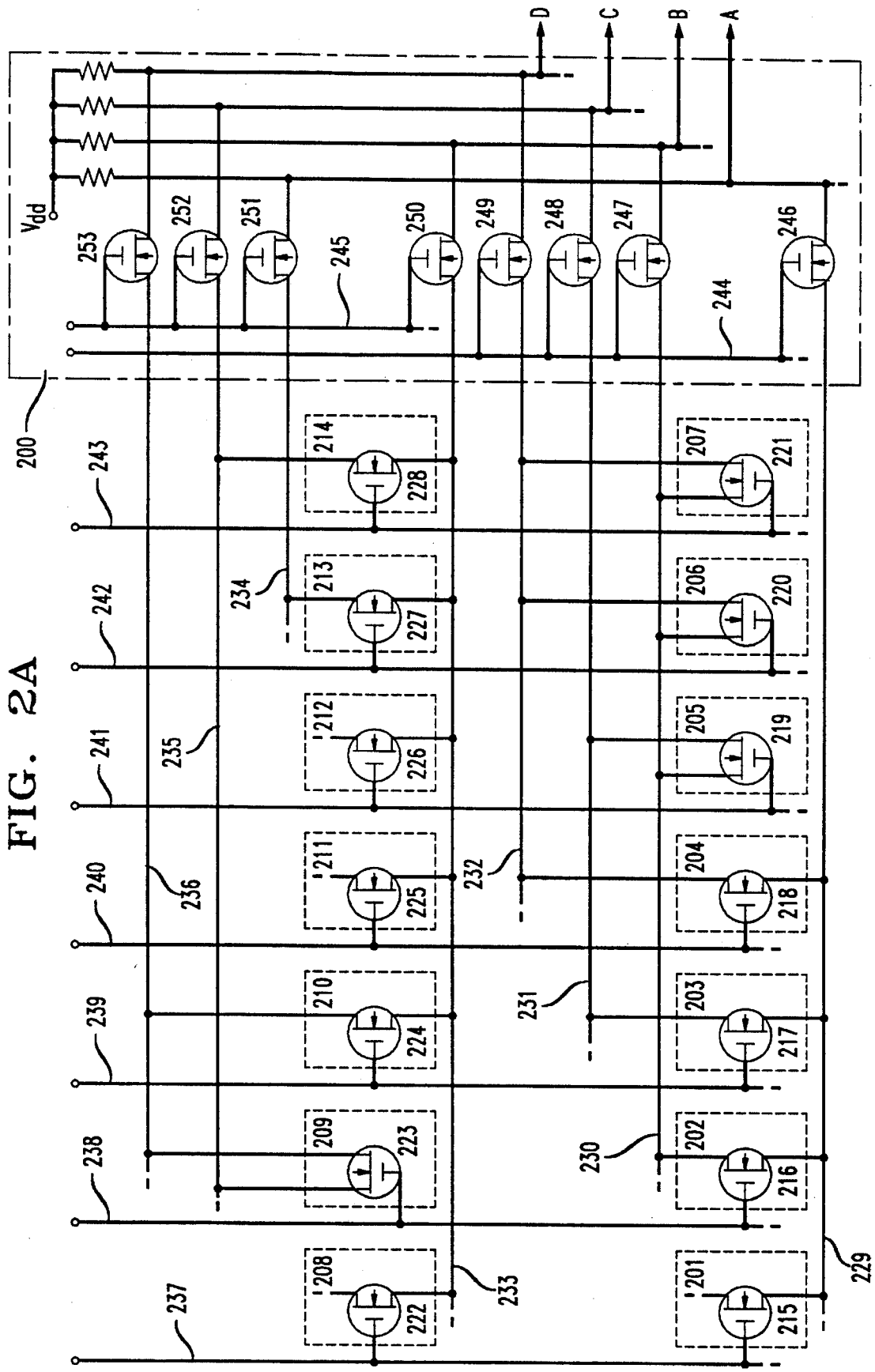
FIGS. 2A and 2B are schematic diagrams showing a decoder circuit and a portion of a high-density ROM that facilitate the practice of an alternate method of the invention.
Figure 2B:
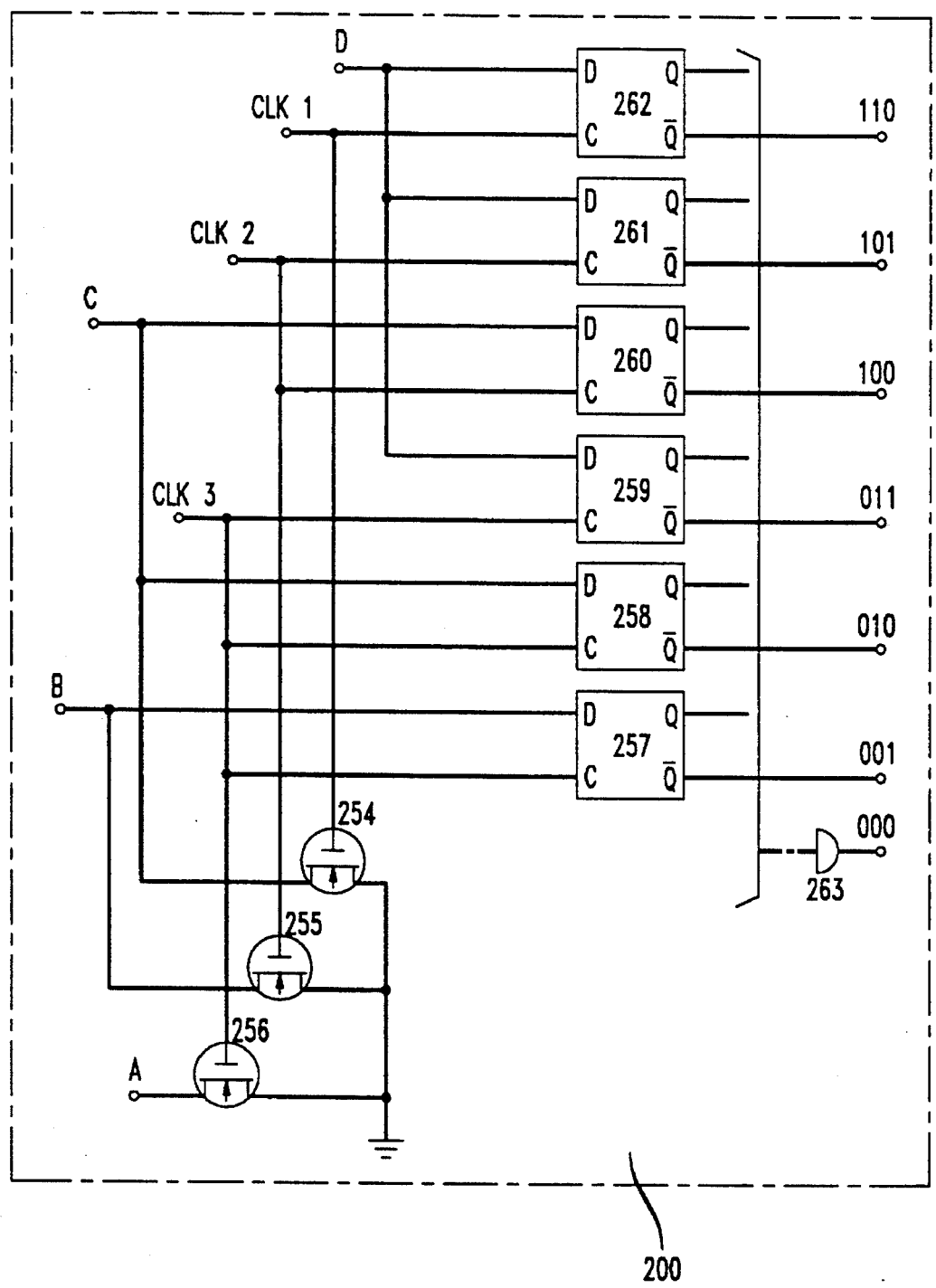

FIGS. 2A and 2B are schematic diagrams showing an alternate decoder circuit (200) and a portion of a high-density ROM that facilitate the practice of the invention. Each memory site (201–214) is shown to include an FET (215–228). Lines 229–236 are bitlines, and lines 237–243 are wordlines. As shown, the memory sites within the ROM can be addressed via four separate bitlines—bitlines 229–232 address memory sites 201–207, and bitlines 233–236 address memory sites 208–214. The four bitline addressing permits seven separate information states to be stored at each memory site, as follows:. For example, for memory sites 201–207:

an FET connection between a most-significant bit line (232, 236) and a second most-significant bit line (231, 235) represents the bit series 110;

an FET connection between a most-significant bit line (232, 236) and a second least-significant bit line (230, 234) represents the bit series 101;

an FET connection between a second most-significant bit line (231, 235) and a second least-significant bit line (230, 234) represents the bit series 100;

an FET connection between a most-significant bit line (232, 236) and a least-significant bit line (229, 233) represents the bit series 011;

an FET connection between a second most-significant bit line (231, 235) and a least-significant bit line (229, 233) represents the bit series 010;

an FET connection between a second least-significant bit line (230, 234) and a least-significant bit line (229, 233) represents the bit series 001; and no connection between the bitlines at a particular memory site represents the bit series 000.

In conventional single bit-line ROMs, storage of such seven-state information would require three separate memory sites.

In order to read the seven different information states that can be stored at a particular memory site in the circuit of FIGS. 2A and 2B, the four bitlines and one wordline associated with that particular memory site must be accessed. To read the value of the data stored at memory site 207, wordlines 237–242 are grounded to ensure that the channels within associated FETs 215–220 and 222–227) are maintained in a non-conductive state. Simultaneously, wordline 243 is supplied with a voltage $V_{dd}$ so that the channels within FETs 221 and 228 are placed in a conductive state. A connection between decoder circuit 200 and bitlines 229–232 is then effected by supplying bitline control conductor 244 with voltage $V_{dd}$, while grounding bitline control conductor 245. This places the channels within FETs 246–249 into conductive states, and maintains the channels within FETs 250–253 in non-conductive states.

Figure 3:
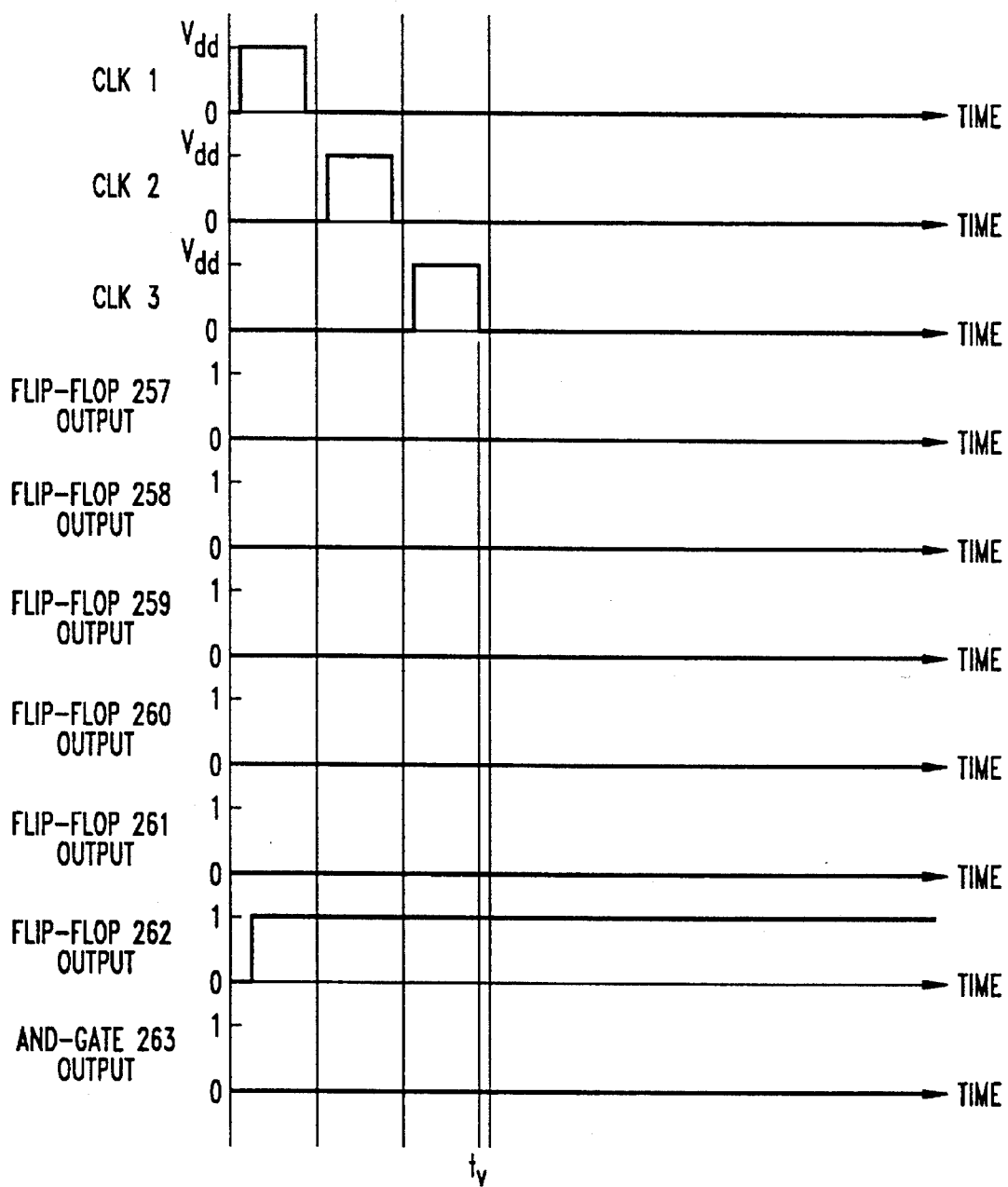
FIG. 3 provides an illustration of various signal waveforms that are applied to and produced by the circuit of FIGS. 2A and 2B.

FETs 254–256 (FIG. 2B) are then clocked sequentially with non-overlapping signals CLK 1, CLK 2 and CLK 3 as illustrated in FIG. 3. Following one full sequence of the three clock signals, the logic devices in FIG. 2B (257–262) produce an output that is indicative of the FET bitline connections for the FET at the particular memory site being read. A logical 1 signal at the $\overline{Q}$ outputs of flip-flops 257–262 and the output of AND-gate 263 correspond to the following bit series:

| Bit Series | Logical 1 Output at: |
|---|---|
| 110 | $\overline{Q}$ of flip-flop 262 |
| 101 | $\overline{Q}$ of flip-flop 261 |
| 100 | $\overline{Q}$ of flip-flop 260 |
| 011 | $\overline{Q}$ of flip-flop 259 |
| 010 | $\overline{Q}$ of flip-flop 258 |
| 001 | $\overline{Q}$ of flip-flop 257 |
| 000 | AND-gate 263 |

With the bitlines and wordlines in the state described above, memory site 207 is selected for reading, and, after the application of the third sequential clock signal, logic devices 257–263 will produce the following:

high output (logical 1) at the $\overline{Q}$ terminal of flip-flop 262;

low outputs (logical 0s) at the $\overline{Q}$ terminal of flip-flops 257–261 and the output of AND-gate 263.

FIG. 3 provides a depiction of the output signals for the logic devices shown in FIG. 2 as the sequence of the three clock signals are applied during the reading of memory site 207. The outputs of the logic devices are considered to provide valid information following the application of the third sequential clock signal (valid from time $t_v$ on).

It will be understood that the ROM/decoder arrangements of FIGS. 1, 2A and 2B are only portions of a larger devices containing many more rows and columns of memory sites that are accessed and read in a manner similar to that described above. Furthermore, the particular methods described above are only illustrative of the principles of the present invention, and that various modifications could be made by those skilled in the art without departing from the scope and spirit of the present invention. One such modification would include applying the invention to ROM/decoder arrangements wherein each memory site is capable of being addressed via many more than four bitlines. In general, the multi-bitline memory scheme of the invention provides for $(n(n-1)/2)+1$ states to be represented at a single memory site; where n is the number of bitlines provided for connection to a single memory site. For example, if the basic architecture of the circuitry of FIGS. 2A and 2B is applied to a ten bitline per memory site arrangement, each memory site would be capable of representing one of 46 unique states—Analogous to data that would normally require M separate memory sites for representation; where $M = \lceil \log_2((n(n-1)/2)+1) \rceil$. In the case where n=10, the number of individual memory sites, M, would be 6. It will also be understood that any number of logic circuit arrangements (combinational, sequential, or hybrid) can be employed as a decoder for the multi-bitline ROM arrays disclosed and claimed. The design of logic circuit arrangements suited to such decoding (many inputs resulting in one selected output) is well known in the art.

The invention claimed is:

1. A read-only memory device comprising:

an array of individual memory sites including at least one switchable memory element at each of said sites;

a plurality of bitlines, each capable of being connected to each of said switchable memory elements in a particular row of said memory site array; and a decoding circuit connected to said plurality of bitlines, adapted to provide an output indicative of the connection of a specific switchable memory element in said particular row of said memory sites to one of said plurality of bitlines whereby, for n bitlines, each individual memory element represents one of a plurality of $((n(n-1)/2)+1)$ unique information states.

2. The invention of claim 1 wherein said switchable memory element comprises a transistor.

3. The invention of claim 1 wherein said decoding circuit includes sequential logic elements.

4. The invention of claim 1 wherein said decoding circuit includes combinational logic elements.

5. The apparatus as recited in claim 1, wherein each of said switchable memory elements is connected to no more than one, if any, of said bitlines.

6. The apparatus as recited in claim 1, wherein each of said switchable memory elements is connected at least one of said bitlines.

7. A read-only memory device comprising:

an array of individual memory sites including at least one switchable memory element at each of said sites;

a plurality of n bitlines, each capable of being connected to each of said switchable memory elements in a particular row of said memory site array; and an n-line to $((n(n-1)/2)+1)$-line decoding circuit connected to said plurality of n bitlines, adapted to provide an output on a particular one of said $(n(n-1)/2)+1$ output lines indicative of the connection of a specific switchable memory element in said particular row of said memory sites to one of said n bitlines.

8. The invention of claim 7 wherein said switchable memory element comprises a transistor.

9. The invention of claim 7 wherein said n-line to $((n(n-1)/2)+1)$-line decoding circuit includes sequential logic elements.

10. The invention of claim 7 wherein said n-line to $((n(n-1)/2)+1)$-line decoding circuit includes combinational logic elements.

11. The apparatus as recited in claim 7, wherein each of said switchable memory elements is connected to no more than one, if any, of said bitlines.

12. The apparatus as recited in claim 7, wherein each of said switchable memory elements is connected at least one of said bitlines.

* * * * *